United States Patent [19]
Miyaoka

[11] Patent Number: 5,265,060
[45] Date of Patent: Nov. 23, 1993

[54] SEMICONDUCTOR INTEGRATED CIRCUIT DEVICE WITH POWER CONSUMPTION REDUCING ARRANGEMENT

[75] Inventor: Shuichi Miyaoka, Tokyo, Japan

[73] Assignee: Hitachi, Ltd., Tokyo, Japan

[21] Appl. No.: 832,334

[22] Filed: Feb. 7, 1992

Related U.S. Application Data

[63] Continuation of Ser. No. 492,329, Mar. 12, 1990, Pat. No. 5,111,432, which is a continuation of Ser. No. 259,459, Oct. 14, 1988, abandoned, which is a continuation of Ser. No. 686,600, Dec. 26, 1984, abandoned.

[30] Foreign Application Priority Data

Dec. 26, 1983 [JP] Japan ............... 58-243807

[51] Int. Cl.⁵ ................................ G11C 7/00
[52] U.S. Cl. .................... 365/208; 365/177;
365/190; 365/225.6; 365/233.5
[58] Field of Search ............. 365/154, 174, 177, 190,
365/205, 207, 208, 225.6, 233, 233.5; 307/494,
495, 530

[56] References Cited

U.S. PATENT DOCUMENTS

| | | | |
|---|---|---|---|
| 4,604,533 | 8/1986 | Miyamoto et al. | 307/530 |
| 4,616,342 | 10/1986 | Miyamoto | 365/190 |
| 4,658,159 | 4/1987 | Miyamoto | 307/530 |

*Primary Examiner*—Joseph A. Popek
*Attorney, Agent, or Firm*—Antonelli, Terry, Stout & Kraus

[57] ABSTRACT

In semiconductor circuits, and particularly in memories, it is often desirable to use bipolar transistors for speed together with MOS elements. However, although the bipolar transistors are useful for speed considerations, they undesirably significantly increase the power consumption of the overall circuit. Accordingly, to reduce power consumption, a bipolar/MOSFET arrangement is provided wherein MOSFETs are used as current sources to supply operation currents to the bipolar transistors only during the periods of their operation. Thus, a semiconductor integrated circuit device is achieved featuring a high operation speed yet consuming reduced amounts of electric power. Additionally, power consumption can be further reduced by providing a time serial operation for actuation of the MOSFETs in different peripheral circuits for a memory array.

15 Claims, 4 Drawing Sheets

SEMICONDUCTOR INTEGRATED CIRCUIT DEVICE WITH POWER CONSUMPTION REDUCING ARRANGEMENT

This is a continuation of application Ser. No. 492,329 filed Mar. 12, 1990, now U.S. Pat. No. 5,111,432, which is a continuation of application Ser. No. 259,459 filed Oct. 14, 1988, now abandoned, which is a continuation of application Ser. No. 686,600 filed Dec. 26, 1984, now abandoned.

FIELD OF THE INVENTION

The present invention relates to a semiconductor integrated circuit device, and particularly to a technique that can be effectively adapted to, for instance, CMOS (complementary MOS)-type or bipolar-type static RAMs (random access memories).

BACKGROUND OF THE INVENTION

It has been known to employ bipolar transistors for reading/wiring circuits and digit line select circuits, in order to increase the operation speed of CMOS static RAMs. For example, such an arrangement has been disclosed in Japanese Patent Laid-Open No. 58193/1981.

In such a semiconductor memory device, since an operation (bias) current is supplied at all times to the bipolar transistor, the current consumed becomes a very large value. Therefore, there arises a serious defect directed in that it is impractical to have a battery back-up operation, even though a great merit of a CMOS static RAM is the fact that such a battery back-up operation is generally available. In the reading circuit, furthermore, a bipolar transistor is used as a column switching circuit, and a current is supplied to a memory cell that is selected via the column switching circuit to obtain a reading signal. However, the value of reading current cannot be increased since it is determined by the conductance of MOSFET in the memory cell. This is because, although the element size must be increased to increase the reading current, it is not allowed to increase the element size of the momory cells from the standpoint of increasing the memory capacity. Therefore, despite the fact that the bipolar transistors are employed, the reading speed of the above-mentioned conventional semiconductor memory device cannot be so increased. Further, since the column switching circuit is constituted by the bipolar transistors, it becomes difficult to set the level (select/non-select levels) of output signals of the column address decoder circuit.

OBJECTS OF THE INVENTION

An object of the present invention is to provide a semiconductor integrated circuit device which accomplishes a high operation speed while preventing the generation of ineffective current.

Another object of the present invention is to provide a CMOS static-type RAM which accomplishes a high operation speed without impairing the advantage of low power consumption of the CMOS circuit.

A further object of the present invention is to provide a bipolar RAM which helps greatly reduce the consumption of electric power.

The above and other objects as well as novel features of the present invention will become obvious from the description of the specification and the accompanying drawings.

SUMMARY OF THE INVENTION

To accomplish these and other objects, MOSFETs are provided as current sources to supply operation currents to be bipolar transistors only during the periods of their operation, there is provided a semiconductor integrated circuit device featuring a high operation speed yet consuming reduced amounts of electric power.

DETAILED DESCRIPTION

Embodiment 1

Figure 1:
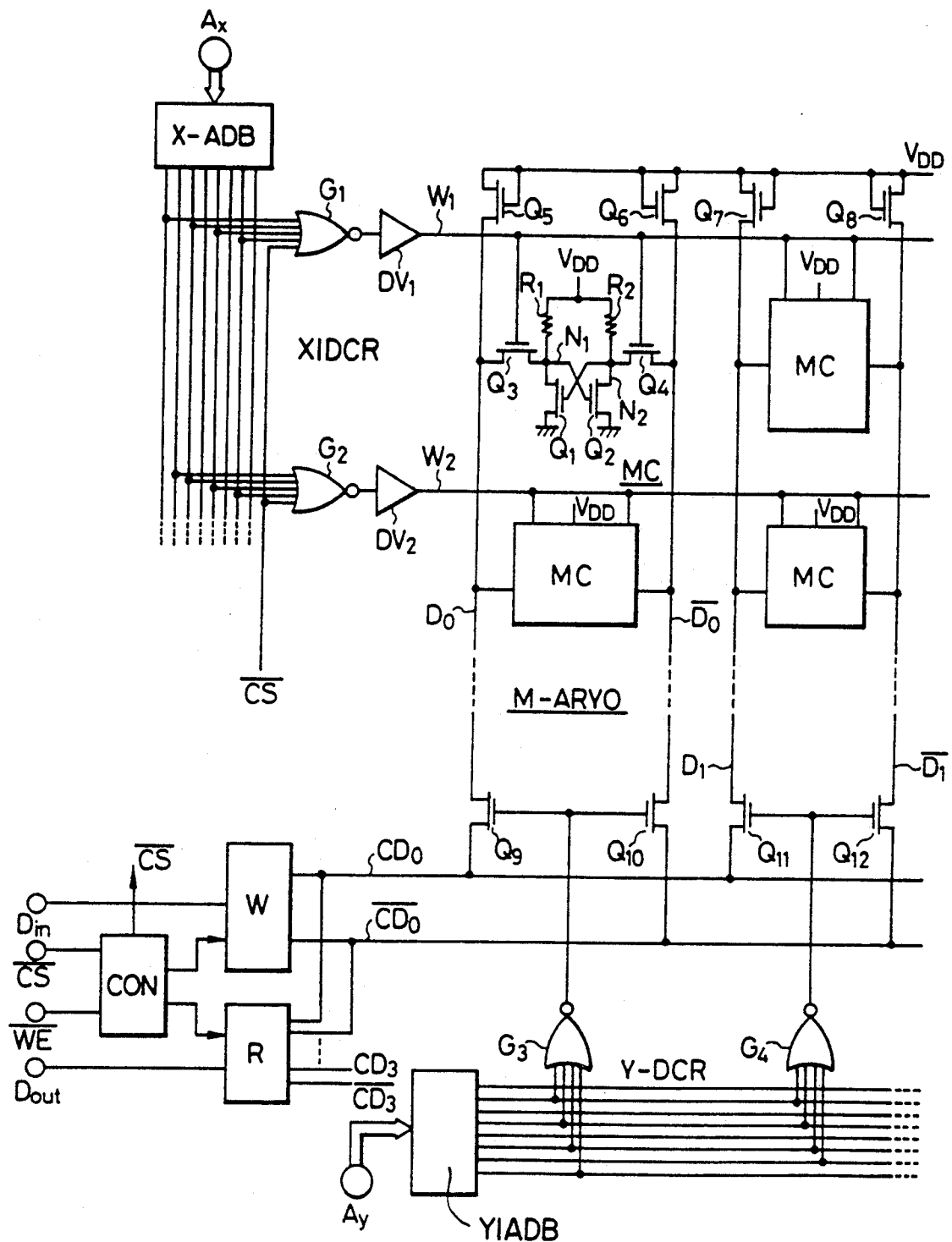
FIG. 1 is a circuit diagram of a first embodiment wherein the present invention is adapted to a CMOS static-type RAM.

FIG. 1 shows a circuit diagram of a first embodiment in which the present invention is adapted to a CMOS static-type RAM. Though there is no particular limitation, the RAM of the same drawing is formed on a semiconductor substrate such as of a single silicon crystal in accordance with well-known techniques for producing bipolar (Bi) and CMOS (complementary MOS) integrated circuits (ICs). Terminals $A_x$, $A_y$, $D_{in}$, $D_{out}$, $\overline{WE}$ and $\overline{CS}$ serve as external terminals. Incidentally, power supply terminals are omitted in the drawing. Though there is no particular limitation, the CMOS static-type RAM of this embodiment has a memory capacity of about 64 kilo-bits. In order to reduce the stray capacitance that resides in a common data line that will be mentioned later, the memory array is divided into four blocks.

A concrete circuit of memory cell MC is shown representatively. Namely, the memory cell consists of memory (drive) MOSFETs Q1 and Q2 of which the gates and drains are coupled in a crossing manner (in a latched form), and high resistances R1 and R2 formed by polycrystalline silicon layers for holding the data, that are provided between the drains of the MOSFETs Q1, Q2 and a power-source voltage $V_{DD}$. Transfer gate MOSFETs Q3 and Q4 are provided between the commonly connected points of MOSFETs Q1, Q2 and the complementary data lines (or digit lines) D0, $\overline{D0}$. Other memory cells MC have also been constructed in the same manner as above. These memory cells MC are arranged in the form of a matrix to constitute a memory array M-ARY0 that is representatively shown in FIG. 1. Namely, gates of the transfer gate MOSFETs Q3, Q4 of memory cells arranged in the same row are commonly connected to their corresponding word lines W1 and W2, and input/output terminals of memory cells arranged in the same column are connected to their corresponding pairs of complementary data lines D0, $\overline{D0}$ and D1, $\overline{D1}$.

In order to reduce the power consumption of the memory cells MC, the resistor R1 has a resistance which is as high as that necessary for the gate voltage of the MOSFET Q2 to be maintained higher than a threshold voltage thereof when the MOSFET Q1 is rendered nonconductive. Similarly, the resistor R2 also has a high resistance. In other words, the resistor R1 has the ability to supply an electric current to such a degree that the data or electric charge stored in the gate capacity (not shown) of MOSFET Q2 is not discharged by a drain leakage current of MOSFET Q1.

According to this embodiment, the memory cell MC is constituted by n-channel MOSFETs and polycrystalline silicon resistance elements as described above, though the memory array is produced by the CMOS-IC technique This helps reduce the sizes of memory cells and memory array compared with when p-channel MOSFETs are used instead of the polycrystalline silicon resistance elements. That is, the polycrystalline silicon resistors can be formed as a unitary structure together with the gate electrodes of driving MOSFETs Q1, Q2, and their sizes can be reduced, too. Unlike the case of using p-channel MOSFETs, furthermore, large spacing distances are not required from the driving MOSFETs Q1, Q2 and, hence, useless blank portions are not formed.

In the figure, the word line W1 is selected by a driving circuit DV1 which receives a select signal formed by an X-address decoder X-DCR. The same also holds true for the other word line W2.

The X-address decoder X-DCR is constituted by NOR gate circuits G1, G2 and so on that resemble one another. The inputs of these NOR gate circuits G1, G2 and so on receive internal complementary address signals in predetermined combinations, the internal complementary address signals being produced by the X-address buffer X-ADB that receives external address signals $A_x$ supplied from a suitable circuit that is not shown.

Though there is no particular limitation, the pairs of data lines D0, $\overline{D0}$ and D1, $\overline{D1}$ in the memory array M-ARY0 are connected to common data lines CD0, $\overline{CD0}$ via column switching circuits constituted by transfer gate MOSFETs Q9, Q10, Q11 and Q12 for select data lines. To the common data lines CD0, $\overline{CD0}$, there are connected input terminals of a reading circuit R and output terminals of a writing circuit W. Common data lines of other memory arrays M-ARY0 to M-ARY3 that are not shown, have also been connected to their corresponding input terminals of the reading circuit R and to their corresponding output terminals of the writing circuit W. The output terminal of the reading circuit R sends a read signal to the data output terminal $D_{out}$, and a write data signal is applied from the data input terminal $D_{in}$ to the input terminal of the writing circuit W.

Select signals Y1, Y2 are supplied from a Y-address decoder Y-DCR to the gates of MOSFETs Q9, Q10, Q11 and Q12 that constitute the above-mentioned column switching circuits. The Y-address decoder Y-DCR are constituted by NOR gate circuits G3, G4 and so on that resemble one another. To the input terminals of these NOR gate circuits G3, G4 are applied internal complementary address signals in predetermined combinations, the internal complementary address signals being produced by the Y-address buffer Y-ADB that receives external address signals $A_y$ from a suitable circuit that is not shown.

A control circuit CON produces an internal control timing signal upon receipt of control signals from the external terminals $\overline{WE}$, $\overline{CS}$.

Though there is no particular limitation in this embodiment, an internal chip select signal $\overline{CS}$ of the non-select condition which is formed by the control circuit CON and which has the high level when the chip has not been selected is applied to the input terminals of the NOR gate circuits G1, G2 and so on constituting the X-address decoder X-DCR, so that all of the word lines are placed under the non-selected condition. This prevents a direct current from flowing through a load MOSFET Q5 of the data line, the transfer gate MOSFET Q3 of a memory cell MC connected to any word line that has been selected, and a memory MOSFET Q1 that has been rendered conductive, when the chip has not been selected.

Figure 2:
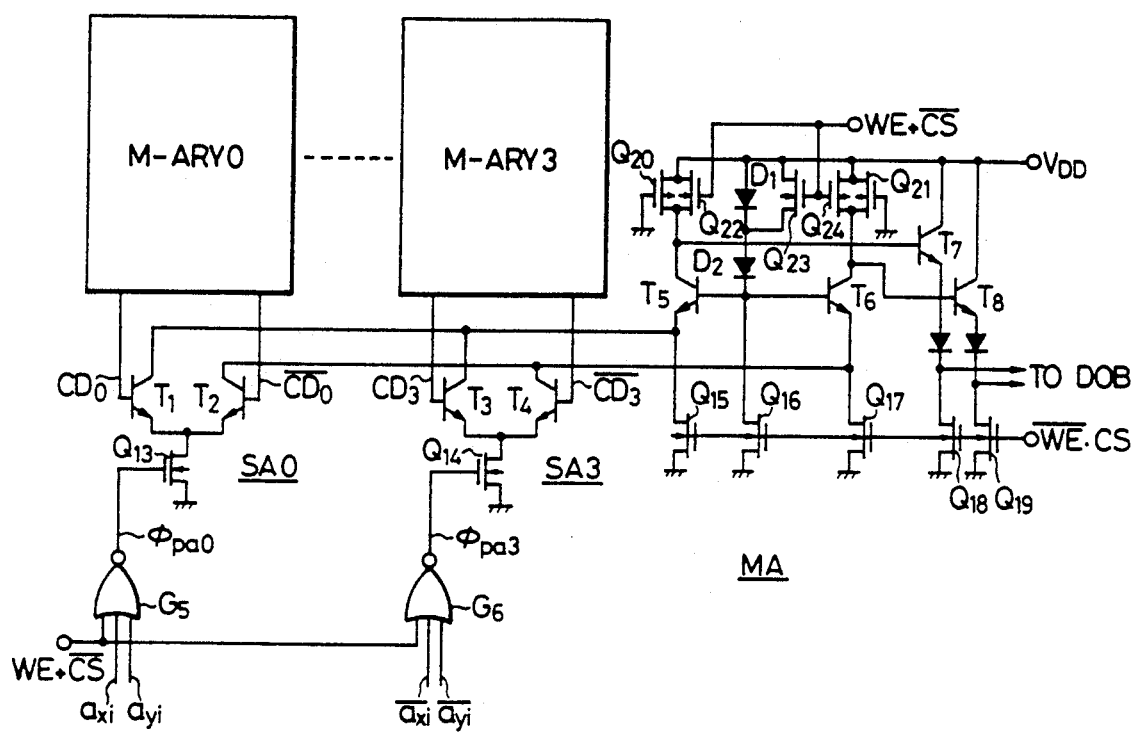
FIG. 2 is a circuit diagram of a reading circuit in the embodiment of FIG. 1.

FIG. 2 is a circuit diagram of the reading circuit according to the embodiment of the present invention.

In this embodiment, use is made of bipolar transistors T1, T2 of a differential form as a sense amplifier SA0 which amplifies a read signal from the memory array M-ARY0. That is, the read voltages of a memory cell appearing on the common data lines CD0, $\overline{CD0}$ are supplied to bases of the differential transistors T1, T2. An n-channel MOSFET Q13 which receives an operation timing signal $\phi_{pa0}$ is connected to common emitters of the differential transistors T1, T2. Another memory array M-ARY3 which is representatively shown is also equipped with a sense amplifier SA3 that consists of similar differential transistors T3, T4, and an n-channel MOSFET Q14. The corresponding collectors of the differential transistors T1, T2, T3 and T4 and so on are commonly connected to a pair of input terminals of the main amplifier MA that will be described later.

Operation timing signals $\phi_{pa0}$, $\phi_{pa3}$ supplied to the gates of MOSFETs Q13, Q14 connected to common emitters of the differential transistors, are formed by NOR gate circuits G5, G6 that receive a read control signal WE+$\overline{CS}$ which level is rendered to low level (logical "0") when the chip is selected and is placed under the read condition. Gates G5 and G6 also receive complementary address signals axi, ayi that select the memory arrays M-ARY0 to M-ARY3. Therefore, only a MOSFET which forms an operation current for a sense amplifier SA corresponding to a memory array that is selected to effect the reading operation, is turned on, and MOSFETs of the remaining three sense amplifiers SA are turned off.

Collectors of the differential transistors T1, T2, T3 and T4 constituting the common sense amplifiers SA0 to SA3 are connected to emitters of the base-grounded amplifier transistors T5, T6 which constitute a circuit of the initial stage of a main amplifier MA. Bases of these transistors T5, T6 are served with a bias voltage formed by the next bias circuit. Namely, serially connected diodes D1, D2 for shifting the level of the power-source voltage $V_{DD}$, and an n-channel MOSFET Q16 for flowing a bias current, are connected in series between the power-source voltage $V_{DD}$ and a point of ground potential. Further, an n-channel MOSFET Q23 is connected in parallel with the diode D1, and, though not specifically limited, the gate of the MOSFET Q23 is served with a read control signal WE+$\overline{CS}$ which assumes the low level during the reading operation. N-channel MOSFETs Q15, Q17 are connected to the emitters of the transistors T5, T6 to form bias currents therefore. The gates of these MOSFETs Q15, Q17 are served with a control signal $\overline{WE}\cdot CS$ which assumes the high level during the reading operation. Therefore, the MOS- FETs Q15 to Q17 are turned on only during the reading operation to form bias currents, respectively.

P-channel MOSFETs Q20, Q21 and n-channel MOSFETs Q22, Q24 are connected in parallel, as load means between the power-source voltage $V_{DD}$ and the collectors of the transistors T5, T6. The p-channel MOSFETs Q20, Q21 are rendered conductive at all times since their gates are always served with ground potential of the circuit, and the gates of the n-channel MOSFETs Q22, Q24 are served with the read control signal $WE + \overline{CS}$.

Collector outputs of these transistors T5, T6 are transmitted to a data output buffer DOB via emitter-follower transistors T7, T8. The emitters of the transistors T7, T8 are connected to n-channel MOSFETs Q18, Q19 that form operation currents therefore and are served with the read control signal $\overline{WE} \cdot CS$.

Operation of the circuit of this embodiment will be described below with reference to a timing chart of FIG. 3.

In the reading operation, a write enable signal $\overline{WE}$ is set to the high level, and a chip select signal $\overline{CS}$ is set to the low level. Therefore, a read control signal $\overline{WE} \cdot CS$ becomes the high level, and an inverted signal $WE + \overline{CS}$ thereof becomes the low level (not shown). Accordingly, if the address signals axi, ayi supplied at this time assume the low level, the NOR gate circuit G5 is opened to produce an output signal $\phi_{pa0}$ of the high level which renders the MOSFET Q13 conductive. An operation current flows into the differential transistors T1, T2, and the read signal from the memory array M-ARY0 is amplified and is produced through the collectors.

On the other hand, since the control signal $\overline{WE} \cdot CS$ of the main amplifier MA becomes the high level, MOSFETs Q15 to Q19 constituting the current sources are rendered conductive to flow operation currents into the transistors T5 to T8. Therefore, the output signals of the sense amplifier SA0 are supplied to a data output buffer DOB which is not shown, and a read output signal $D_{out}$ is obtained from the external terminal.

With regard to sense amplifiers SA1 to SA3 of other memory arrays M-ARY1 to M-ARY3, the operation timing signals $\phi_{pa1}$ to $\phi_{pa3}$ become the low level, and MOSFETs Q14 and the like that form operation currents, are rendered nonconductive. Therefore, the sense amplifiers SA1 to SA3 establish the condition of high output impedance. Hence, the main amplifier MA is served with only the electric current produced by the selected memory array M-ARY0.

Figure 3:
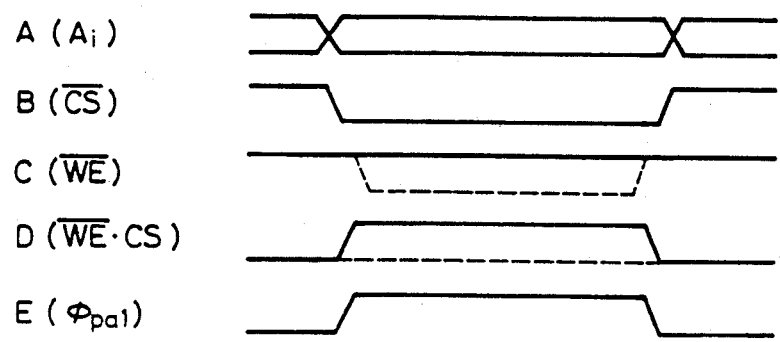
FIG. 3 is a timing chart for illustrating the operation of FIG. 2.

In the writing operation, the write enable signal $\overline{WE}$ is set to the low level as indicated by a broken line in FIG. 3, so that the control signal $\overline{WE} \cdot CS$ becomes the low level and its inverted signal $WE + \overline{CS}$ becomes the high level. Therefore, MOSFETs Q13 to Q19 for forming operation currents for the amplifier transistors of the sense amplifiers SA0 to SA3 and of the main amplifier MA, are all rendered nonconductive to inhibit their operation. In this case, depending upon the conductive condition of MOSFET Q23, the bias voltage of the circuit of the initial stage of the main amplifier MA becomes nearly equal to $V_{DD} - V_f$ ($V_f$ denotes a forward voltage of the diode D2). Further, n-channel MOSFETs Q22 and Q24 that serve as load means are turned on to raise the base potential of the emitter-follower transistors T7, T8, and p-channel MOSFETs (not shown) that constitute a circuit in the input stage of the data output buffer circuit DOB are rendered nonconductive.

Embodiment 2

Figure 4:
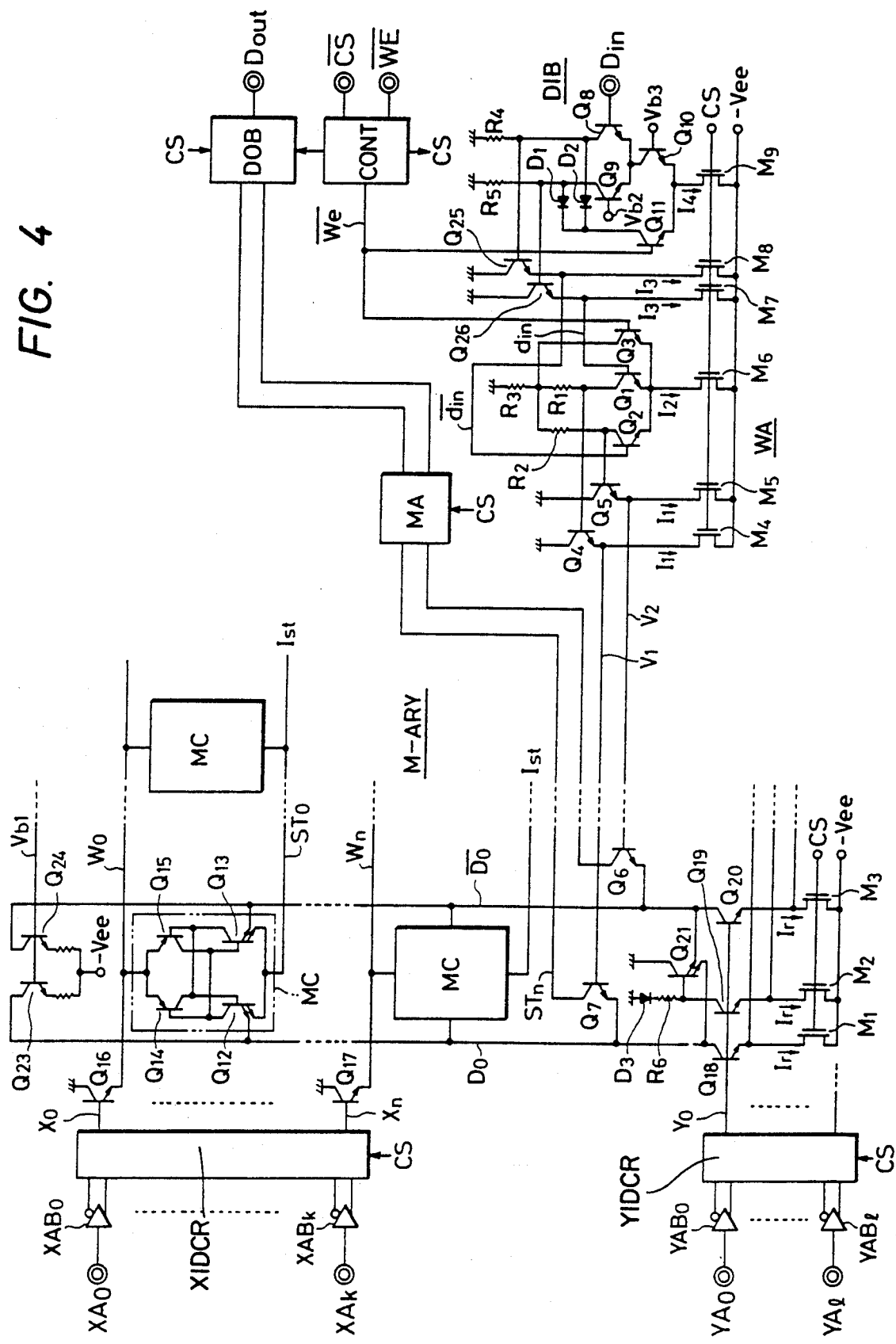
FIG. 4 is a circuit diagram of another embodiment wherein the present invention is adapted to a bipolar-type RAM.

FIG. 4 is a circuit diagram of a second embodiment in which the present invention is adapted to a bipolar-type RAM. The RAM of the figure is formed on a semiconductor substrate such as a single silicon crystal by a technique for manufacturing semiconductor integrated circuits similar to that used in FIG. 1 Terminals XA0 to XAk, YA0 to YAl, $D_{out}$, $D_{in}$, $\overline{CS}$, $\overline{WE}$, $-V_{ee}$ and GND serve as external terminals. The figure, however, does not show power-source terminals $-V_{ee}$ and GND. Unlike the circuit of the embodiment of FIG. 1, furthermore, transistors are denoted by Q, and MOSFETs are denoted by M.

Among a plurality of memory cells constituting a memory array M-ARY, a concrete circuit of only one memory cell is shown in the figure. Though there is no particular limitation, in one memory cell, use is made of a flip-flop circuit which consists of drive npn-type transistors Q12, Q13 of which the bases and collectors are coupled in a crossing manner, and pnp-type transistors Q14, Q15 that are connected to their collectors. Though there is no particular limitation, the drive npn-type transistors Q12, Q13 are of the multi-emitter construction. The emitters on one side are commonly connected together, and the emitters of the other side serve as input/output terminals of a memory cell and are connected to a pair of complementary data lines D0, $\overline{D0}$ that are representatively shown. The drive npn-type transistors Q12, Q13 may be constituted by two transistors of which the base and collectors are commonly connected together. Further, the load transistors Q14, Q15 may be replaced by load resistors and clamping diodes that are connected in parallel with each other. The common emitters of the load transistors Q14, Q15 are connected to a word line W0 which is shown representatively.

With the above-mentioned memory cell as a center, similar memory cells (represented by a black box) of a number of m are arranged along the laterally running row and are connected to the word line W0. The laterally stretching row is provided with a holding current line ST0 which corresponds to the word line W0, and the commonly connected emitters of one side of drive transistors Q12, Q13 of the memory cell are connected thereto. Memory cells are also connected in the same manner as above with respect to another representatively shown row (word line Wn, holding current line STn). The holding current lines ST0, STn are provided with constant-current source Ist (not shown) that supply holding currents to the memory cells.

Further, the similarly constructed memory cells are arranged in a number of n along the vertical column, and input/output terminals thereof are commonly connected to the complementary data lines D0, $\overline{D0}$. Thus, memory cells are arranged in a number of m x n along the rows and columns to constitute a memory array M-ARY.

The word lines W0, Wn which are representatively shown are selected or not selected by word line drive transistors Q16, Q17 that receive address decoded signals X0, Xn which are produced by the X-address decoder X-DCR.

Address signals supplied from a suitable circuit not shown are inputted to the address buffers XAB0 to XABk via external terminals XA0 to XAk. These address buffers XAB0 to XABk form noninverted address signals and inverted address signals depending upon the input address signals, and send them to the X-address decoder X-DCR. Then, the X-address decoder X-DCR forms a word line select signal to select a word line.

In this embodiment, the complementary data lines D0, $\overline{D0}$ representatively shown are connected, via transistors Q18, Q20 that serve as column switches, to n-channel MOSFETs M1 and M3 that are also provided commonly for other complementary data lines not shown, and that are turned on by an internal chip select signal CS to form a read/write current Ir. An address decoded signal Y0 produced by the Y-address decoder Y-DCR is applied to the bases of the transistors Q18 and Q20 that work as column switches. Namely, address signals supplied from a suitable circuit not shown are inputted to the address buffers YAB0 to YABl via external terminals YA0 to YAl. The address buffers YAB0 to YABl produce noninverted address signals and inverted address signals according to the input address signals and send them to the Y-address decoder Y-DCR. Therefore, the Y-address decoder Y-DCR forms a data line select signal to select a pair of complementary data lines. According to this embodiment, though there is no particular limitation, a bias circuit is subsequently provided to apply a predetermined bias voltage to data lines that have not been selected. That is, a diode D3 and a resistor R6 are connected in series between the base and the collector of a transistor Q21 of which the collector is served with ground potential of the circuit. The diode D3 and resistor R6 connected in series are connected, via a transistor Q19, to an n-channel MOSFET M2 that produces a current Ir like the one mentioned above. Though there is no particular limitation, the transistor Q21 is of the multi-emitter construction, and is connected to the complementary data lines D0, $\overline{D0}$.

A source of a very small constant current is coupled to the complementary data lines D0, $\overline{D0}$. Namely, a very small constant current is absorbed at all times by transistors Q23, (Q24) which receive a constant voltage b1 through the bases thereof and which have resistors connected to the emitters thereof.

Therefore, the data line which is not selected is biased by a voltage which is nearly equal to the sum of a forward voltage of the diode D3 and a voltage across the base and emitter of the transistor Q21. When the complementary data lines D0, $\overline{D0}$ are selected, the current Ir produced by the MOSFET M2 that is rendered conductive flows into the resistor R6 via the transistor Q19. Therefore, the transistor Q21 is rendered nonconductive, and potentials of the complementary data lines D0, $\overline{D0}$ are determined with the stored data in the selected memory cell.

Emitters of current switching transistors Q7, Q6 are coupled to the complementary data lines D0, $\overline{D0}$ in order to write/read the data relative to a memory cell of a row that is shown representatively. Collector outputs of these transistors Q7, Q6 are sent to the input terminals of the main amplifier MA which effects the amplification operation and forms an output signal that meets the input level of a data output buffer DOB constituted by ECL (emitter coupled logic). The data output buffer DOB produces a read output signal that will be sent through the external terminal $D_{out}$. The main amplifier MA is constructed similarly to the main amplifier of the emobdiment of FIG. 1.

Output voltages V1, V2 of a writing circuit WA are applied to the bases of the current switching transistors Q7, Q6. The writing circuit WA which forms the output voltages V1, V2 is constituted by differential transistors Q1 to Q3, a constant-current source provided to the common emitters thereof, resistors R1, R2 provided to the collectors of the transistors Q1, Q2, and a resistor R3 provided between the ground potential and a point where the resistors R1, R2 and the collector of the transistor Q3 are commonly connected together. Bases of the transistors Q1, Q2 are served with write data signals $d_{in}$, $\overline{d}_{in}$ sent from a data input buffer DIB that will be described later, and base of the transistor Q3 is served with an internal write enable signal $\overline{we}$ sent from a control circuit CONT that will be described later.

According to this embodiment, though there is no particular limitation, the data input buffer DIB is constructed as described below, so that noise will not generate in the output voltages V1, V2 of the writing circuit WA according to the change of levels of the input data signals $d_{in}$, $\overline{d}_{in}$ during the writing operation. Namely, a transistor Q8 receives a write data signal supplied through the external terminal $D_{in}$, and a transistor Q9 is impressed with a reference voltage Vb2 through the base thereof to discriminate the input signal, and these transistors Q8 and Q9 are connected together in a differential manner. Resistors R4 and R5 are connected to the collectors of these differential transistors Q8 and Q9. Collector outputs of the differential transistors Q8 and Q9 are applied to bases of emitter-follower transistors Q25, Q26, and data signals din and $\overline{d}_{in}$ are sent from the emitters of these transistors Q25 and Q26 to the writing circuit WA. The collector of a differential transistor Q10 is connected to the common emitters of the differential transistors Q8 and Q9, so that the data signals $d_{in}$ and $\overline{d}_{in}$ will not change depending upon the signals from the external terminal $D_{in}$ during the reading operation. A reference voltage Vb3 is applied to the base of the transistor Q10 to discriminate the internal write enable signal $\overline{we}$. The internal write enable signal $\overline{we}$ is applied to the base of the transistor Q11 which is connected in a differential manner relative to the transistor Q10. The collector of the transistor Q11 is connected to the collectors of the differential transistors Q8 and Q9 via diodes D1 and D2.

According to this embodiment, although there is no particular limitation, the operation currents I1 to I4 for the transistors Q1 to Q5 and for the transistors Q8, Q11, Q25 and Q26 are formed by n-channel MOSFETs M4 to M9 that are rendered conductive by an internal chip select signal cs, in order to reduce the ineffective current when the chip is not being selected.

The control circuit CONT which receives control signals supplied via the external terminals $\overline{WE}$ and $\overline{CS}$, produces an operation control signal for the data output buffer DOB, the internal write enable signal $\overline{we}$ that will be supplied to the writing circuit WA and to the data input buffer DIB, and the internal chip select signal cs. Internal circuitry for forming these signals can be constructed utilizing well-established principles for making such control circuitry.

When the control signal $\overline{CS}$ is set to the low level in order to select the chip, the control circuit CONT produces an internal chip select signal cs of the high level. On the other hand, when the control signal $\overline{CS}$ is set to the high level to place the chip under the nonselected condition, the control circuit CONT produces an internal chip select signal cs of the low level.

The reading operation is performed when the terminal $\overline{WE}$ is set to the high level and the terminal $\overline{CS}$ is set to the low level. In the data input buffer DIB in this case, the write enable signal $\overline{we}$ assumes the high level since the terminal $\overline{WE}$ assumes the high level. Therefore, the transistor Q10 is rendered nonconductive, the transistor Q11 is rendered conductive, and the electric current I4 flows being divided into one-half into the resistors R4 and R5 via diodes D1, D2. Therefore, irrespective of the signals from the external terminal $D_{in}$, the output level is fixed to the intermediate level, and noise caused by the change of level at the external terminal $D_{in}$ is prevented from appearing in the read reference voltage V1, V2 ($V_{refc}$) in the reading operation.

According to this embodiment, the read/write current Ir for the memory array M-ARY, and operation current for the writing circuit WA that is representatively shown, are produced by the MOSFETs which are operated by the internal chip select signal cs. Therefore, the ineffective current is prevented from flowing wastefully when the chip is not selected. Current-source circuits for producing operation currents for the peripheral circuits, i.e., for the address decoders X-DCR, Y-DCR, are also constituted by the same MOSFETs that will be rendered conductive upon receipt of the internal chip select signal cs, in order to reduce the ineffective current. When the MOSFETs for producing operation current for the address decoders X-DCR, Y-DCR are rendered nonconductive under the condition where the chip is not selected, the output signals thereof take a non-select level.

Figure 5:
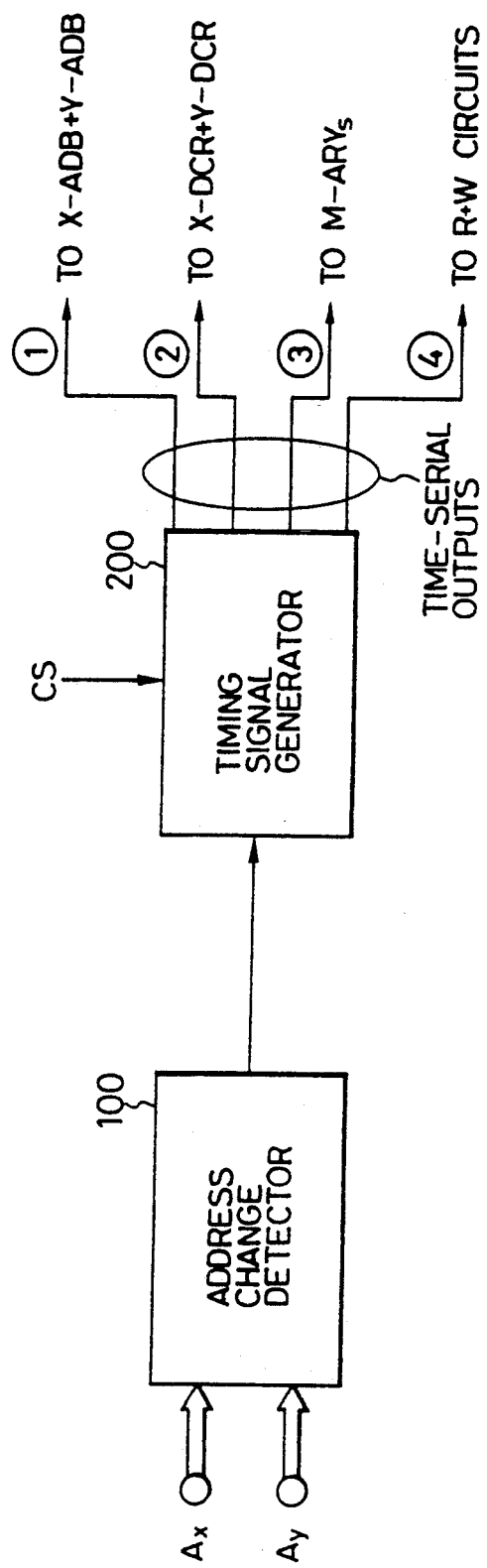
FIG. 5 is a block diagram showing a further power consumption reducing arrangement in accordance with the present invention.

According to this embodiment, the MOSFETs for producing operation currents for the transistors are turned on or off responsive to a chip select signal depending upon whether the chip is selected or not selected, thereby to reduce the current from wastefully flowing under the condition in which the chip is not selected. Furthermore, as shown in FIG. 5, provision may be made of a circuit 100 for detecting the change of address signals, and a circuit 200 which, responsive to the detection outputs thereof, produces timing signals to time-serially operate the address buffer, address decoder, memory array M-ARY, reading circuit and writing circuit in the order mentioned, so that each of the circuit blocks is time-serially operated only at required timings by the operating timing signals, under the condition where the chip is selected. In this case, the consumption of current can be reduced even under the condition where the chip is selected. With regard to such an arrangement, it is noted that construction of the circuit 100 for detecting the change of address signals is well known, and its details are not described here. Similarly, construction of a timing signal generator 200 to produce time-serial timing signals can be done according to well-known design principles for making time circuitry. For instance, the timing signal generator 200 is comprised in combination of CMOS slatic inverters for producing delay signals and CMOS stacit gate circuits for producing the timing signals.

In the aforementioned embodiments 1 and 2, when the operation currents of the bipolar transistors are to be formed, the MOSFETs are operated in the saturated region. Therefore, thw MOSFETs produce a nearly constant operation current for the bipolar transistors.

In the embodiment 1, furthermore, when the address buffer ADB and the address decoder DCR are constituted by MOSFETs and bipolar transistors in order to increase the operation speed (e.g., when a required logic circuit is constituted by the MOSFETs, and a driver circuit constituted by bipolar transistors is provided to receive the output signal of the logic circuit, so that the subsequent stage can be driven at a high speed), operation currents for the bipolar transistors are produced by the MOSFETs, and these MOSFETs are further controlled in the same manner as mentioned earlier, such that the RAM consumes reduced amounts of electric power while still featuring an increased operation speed. In this case, furthermore, provision may be made of a circuit for detecting the change of address signals like the aforementioned circuit 100 for detecting the change of address signals, as well as a timing signal-forming circuit like the aforementioned circuit 200 for forming timing signals, in order to time-serially operate the address buffer, decoder, sense amplifier, writing circuit and the reading circuit in the order mentioned only at required timings, in the same manner as mentioned earlier. This makes it possible to reduce the consumption of electric power even under the condition where the chip is selected. Preferably, the time-series outputs of the circuit 200 are coupled to the MOSFETs of the various peripheral circuits (i.e., address buffers, decoders, etc.) to provide the time-series operation by controlling the turn-on and turn-off time of the MOSFETs which serve as current sources for the bipolar transistor.

By virtue of the construction set forth above, the following advantages can be achieved:

(1) MOSFETs that will be turned on only during the periods of operation are used to produce operation currents for the bipolar transistors that require relatively large operation currents. Therefore, wasteful consumption of electric current is reduced, and the consumption of electric power is greatly reduced.

(2) Since differential transistors consisting of bipolar transistors are used as a sense amplifier in a CMOS static RAM, only a very small electric current is allowed to flow into the data lines in reverse proportion to the current amplification factor. In other words, operation current of the sense amplifier can be increased even when the size of the memory cells is reduced to decrease the current driving ability. This makes it possible to accomplish a high reading operation.

(3) Since MOSFETs that will be turned on only during the reading operation are employed to produce operation currents for the differential transistors that constitute a sense amplifier, wasteful consumption of electric current is reduced. This helps maintain the advantage of low power consumption inherent in the CMOS static RAM, and a device employing bipolar transistor circuits can be realized which is powered by batteries and the like.

(4) The memory array M-ARY is divided into a plurality of blocks, and the sense amplifier is provided with an address decoder function, such that the consumption of electric power is further reduced and the operation speed is further increased.

(5) Since MOSFETs that will be turned on only when the chip is selected are used to produce reading and writing currents for the memory array M-ARY in the bipolar RAM and to produce currents for such peripheral circuits as the writing circuit and the reading circuit, it is made possible to greatly reduce the wasteful consumption of electric current when the chip is not being selected.

(6) MOSFETs are used to produce operation currents for the circuit blocks in the RAM, and the circuit blocks are time-serially operated at required timings responsive to change detection signals of address signals. Therefore, wasteful consumption of electric current can be reduced under the condition in which the chip is selected.

The invention accomplished by the inventor was concretely described in the foregoing by way of embodiments. However, it should be noted that the invention is in no way limited to the above embodiments only but can be variously modified within a scope that does not depart from the gist of the invention. For instance, the resistors for holding data in the memory cells of the embodiment of FIG. 1 may be replaced by p-channel MOSFETs. In place of the CMOS circuit, furthermore, either the n-channel MOSFETs or p-channel MOSFETs may be employed. Further, the peripheral circuits and the timing control can be realized in a variety of other ways.

Moreover, the gates of p-channel MOSFETs which produce operation currents for the bipolar transistors may be served with a predetermined constant voltage at the timings of operation.

The foregoing description has dealt with the case in which the invention accomplished by the inventor was adapted to the CMOS static RAM and to the bipolar RAM that served as the background of the invention. The invention, however, should in no way be limited thereto only, but can be widely adapted to semiconductor integrated circuit devices that include bipolar transistors for amplifying and transmitting signals and a circuit that produces operation currents for the bipolar transistors.

I claim:

1. A semiconductor memory device comprising:
   a memory array;
   bipolar transistors that generate output signals during a period of their operation, wherein said bipolar transistors are coupled to said memory array;
   MOSFETs coupled to said bipolar transistors and responsive to control signals for selectively providing operating current to said bipolar transistors;
   an address signal detection circuit coupled to said memory array to detect addresses selected in said memory array; and
   a timing generator circuit coupled to said address signal detection circuit and for forming time-serial timing signals as said control signals according to whether a writing/reading operation is to be conducted for said memory array,
   wherein said MOSFETs are time-serially operated according to said time-serial timing signals.

2. A semiconductor memory device according to claim 1, further comprising:
   memory cells formed in said memory array for storing data therein, said memory cells being comprised of MOSFETs or bipolar transistors.

3. A semiconductor memory device according to claim 1, wherein said bipolar transistors are of an NPN type.

4. A semiconductor memory device according to claim 1, wherein said MOSFETs are of an N-channel type.

5. A semiconductor integrated circuit device comprising:
   a memory array including a plurality of word lines, a plurality of pairs of data lines and a plurality of memory cells coupled to said plurality of word and data lines so that each memory cell is coupled to a word line and a pair of data lines;
   a read circuit, coupled to said memory array to provide output signals indicative of data stored in said memory cells, comprising:
      a sense amplifier including a first control MOSFET, and a pair of bipolar transistors coupled to form a differential circuit with bases thereof being coupled to a selected one of said plurality of pairs of data lines and with a common emitter thereof being coupled to said first control MOSFET to provide operating current to said differential circuit only when a first predetermined signal is received by said first control MOSFET indicating that said memory array has been selected for operation; and
      a main amplifier including a pair of bipolar transistors coupled to receive collector outputs of said pair of bipolar transistors in said sense amplifier and at least one second control MOSFET coupled to provide operating current to said pair of bipolar transistors in said main amplifier when a second predetermined signal is received by said second control MOSFET indicating that said memory array has been selected,
   wherein said read circuit will provide output signals indicative of data stored in said memory cells only when said first predetermined signal and said second predetermined signal indicate that said memory array has been selected for operation.

6. A semiconductor integrated circuit device according to claim 5, wherein said memory cells of said memory array are comprised of MOSFETs forming static memory cells.

7. A semiconductor integrated circuit device according to claim 5, wherein said memory cells of said memory array are comprised of bipolar transistors to form a bipolar-type RAM.

8. A semiconductor integrated circuit device according to claim 7, wherein said memory cell include a pair of cross-coupled bipolar transistors.

9. A semiconductor integrated circuit device according to claim 5, wherein said first control MOSFET is coupled to have its drain-source path coupled to said common emitter of said pair of bipolar transistors in said sense amplifier and to have its gate coupled to receive said first predetermined signal.

10. A semiconductor integrated circuit device according to claim 9, wherein a plurality of memory arrays are provided, each with one of said sense amplifiers coupled thereto, and further comprising a gate circuit coupled to each of said sense amplifiers to provide said first predetermined signal to said gate of said first control MOSFET of the respective sense amplifier to which said gating circuit is coupled, wherein each said gating circuit comprises means for providing said first predetermined signal to said first control MOSFET of the respective sense amplifier to which said gating circuit is coupled when the respective memory array to which said respective sense amplifier is coupled has been selected for operation.

11. A semiconductor integrated circuit device according to claim 5, further comprising:
    a writing circuit having a plurality of bipolar transistors coupled to a selected one of said plurality of pairs of data lines; and
    a third control MOSFET coupled to said plurality of bipolar transistors in said writing circuit to provide an operating current to said plurality of bipolar transistors in said writing circuit when a third predetermined control signal is received by said third control MOSFET.

12. A semiconductor integrated circuit device according to claim 11, further comprising a data input buffer coupled between a data input terminal and said writing circuit, wherein said data input buffer includes a plurality of bipolar transistors coupled to said data input terminal and to said bipolar transistors of said writing circuit, said data input buffer further comprising a fourth control MOSFET coupled to said bipolar transistors in said data input buffer for providing an operating current to said bipolar transistors in said data input buffer when a fourth predetermined signal is received by said fourth control MOSFET.

13. A semiconductor integrated circuit device according to claim 12, further comprising:
   means for determining when an address change has been made; and
   a timing generator circuit for operating said first and second or third and fourth control MOSFETs time-serially in accordance with a predetermined time series of circuit operation.

14. A semiconductor integrated circuit according to claim 5, wherein said pairs of bipolar transistors in said sense and main amplifiers are of an NPN type.

15. A semiconductor integrated circuit device according to claim 5, wherein said first and second control MOSFETs are of an N-channel type.

* * * * *